United States Patent
Pritz

(10) Patent No.: US 6,354,445 B1
(45) Date of Patent: Mar. 12, 2002

(54) RACK HOLDING DEVICE

(75) Inventor: Guenter Pritz, Waldkraiburg (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/407,823

(22) Filed: Sep. 28, 1999

(30) Foreign Application Priority Data

Oct. 2, 1998 (DE) .......................................... 198 45 504

(51) Int. Cl.[7] .............................................. A47G 19/08
(52) U.S. Cl. ..................... 211/41.18; 206/454; 206/711; 206/710; 414/416; 414/417; 414/217
(58) Field of Search ....................... 211/41.18; 206/454, 206/711, 710; 414/416, 217, 417

(56) References Cited

U.S. PATENT DOCUMENTS

| | | | |
|---|---|---|---|
| 4,493,606 A | * 1/1985 | Foulke et al. ................. 414/787 |
| 4,705,951 A | * 11/1987 | Layman et al. .......... 250/442.1 |
| 4,776,744 A | 10/1988 | Stonestreet et al. |
| 4,819,167 A | * 4/1989 | Cheng et al. ............ 364/167.01 |
| 5,102,495 A | * 4/1992 | Maher et al. ................ 165/643 |
| 5,149,244 A | * 9/1992 | Webber et al. .............. 414/417 |
| 5,217,341 A | 6/1993 | Webber et al. |
| 5,246,218 A | * 9/1993 | Yap et al. ..................... 269/309 |
| 5,344,542 A | * 9/1994 | Maher et al. .......... 204/298.15 |
| 5,382,127 A | * 1/1995 | Garric et al. ........... 414/416 X |
| 5,382,806 A | * 1/1995 | Bacchi et al. ................ 250/561 |
| 5,466,945 A | * 11/1995 | Brickell et al. ......... 250/559.12 |
| 5,474,410 A | * 12/1995 | Ozawa et al. ................ 414/217 |
| 5,525,024 A | * 6/1996 | Freerks et al. ............... 414/416 |
| 5,604,443 A | * 2/1997 | Kitamura et al. ....... 414/416 X |
| 5,697,748 A | * 12/1997 | Somekh et al. ......... 414/416 X |
| 5,779,203 A | * 7/1998 | Edlinger ................... 248/178.1 |
| 5,788,082 A | * 8/1998 | Nyseth ......................... 206/711 |
| 5,902,088 A | * 5/1999 | Fairbairn et al. ....... 414/937 X |
| 5,947,677 A | 9/1999 | Matsushima et al. |
| 5,957,292 A | * 9/1999 | Mikkelsen et al. ...... 206/454 X |
| 5,980,187 A | * 11/1999 | Verhovsky ................... 414/416 |
| 5,988,191 A | * 11/1999 | Duncan ............... 211/41.18 X |
| 6,036,031 A | * 3/2000 | Ishikawa ................... 211/41.18 |
| 6,039,186 A | * 3/2000 | Bhatt et al. .................. 206/711 |
| 6,040,585 A | * 3/2000 | Hsiao ....................... 250/559.4 |
| 6,075,334 A | * 6/2000 | Sagues et al. .......... 318/568.11 |
| 6,082,950 A | * 7/2000 | Altwood et al. ............. 414/217 |
| 6,085,125 A | * 7/2000 | Genov ......................... 700/218 |

FOREIGN PATENT DOCUMENTS

| | | |
|---|---|---|
| CH | 683 420 | 3/1994 |
| GB | 2141 681 | 1/1985 |
| JP | 8-290804 | 11/1996 |

OTHER PUBLICATIONS

Patent Abstracts of Japan, vol. 1997, No. 03, Mar. 31, 1997.
Derwent Abstract Corresponding to CH 683420 [AN 1994–074873].

* cited by examiner

*Primary Examiner*—Robert W. Gibson, Jr.
*Assistant Examiner*—Khoa Tran
(74) *Attorney, Agent, or Firm*—Collard & Roe, P.C.

(57) ABSTRACT

A rack-holding device with an attachment surface (1), which device has as least two side guides (2) and at least one stop (3), the stop (3) being arranged in each case in front of the at least two side guides (2), and the two side guides (2) being arranged parallel to and at a distance form one another. The two side guides (2) are designed in such a way that they have a bearing surface at essentially the same height. The two side guides (2) are each connected to the attachment surface (1). A sensor (7) is located on the attachment surface (1) and the sensor detects if a rack is in the position in the rack-holding device.

5 Claims, 3 Drawing Sheets

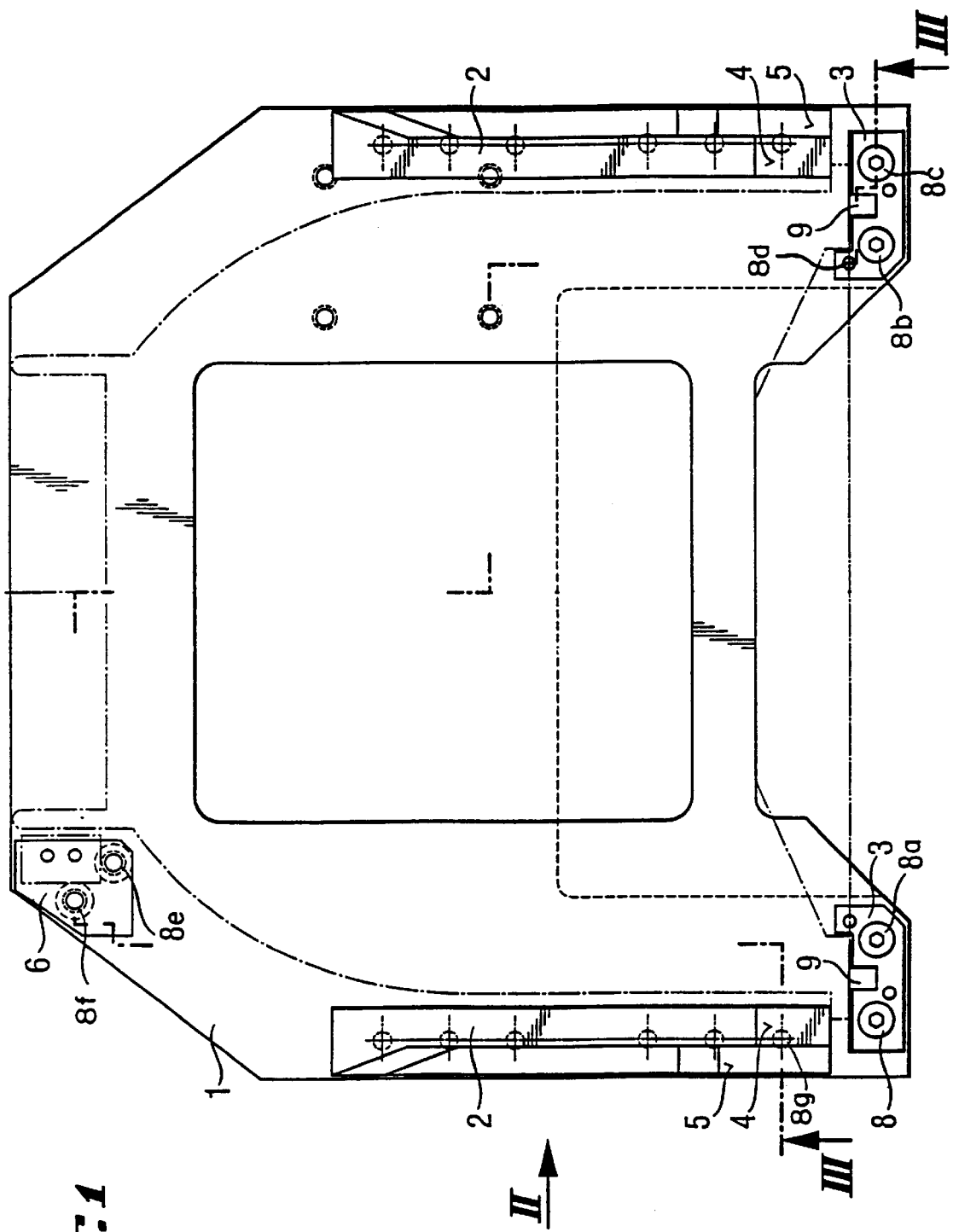

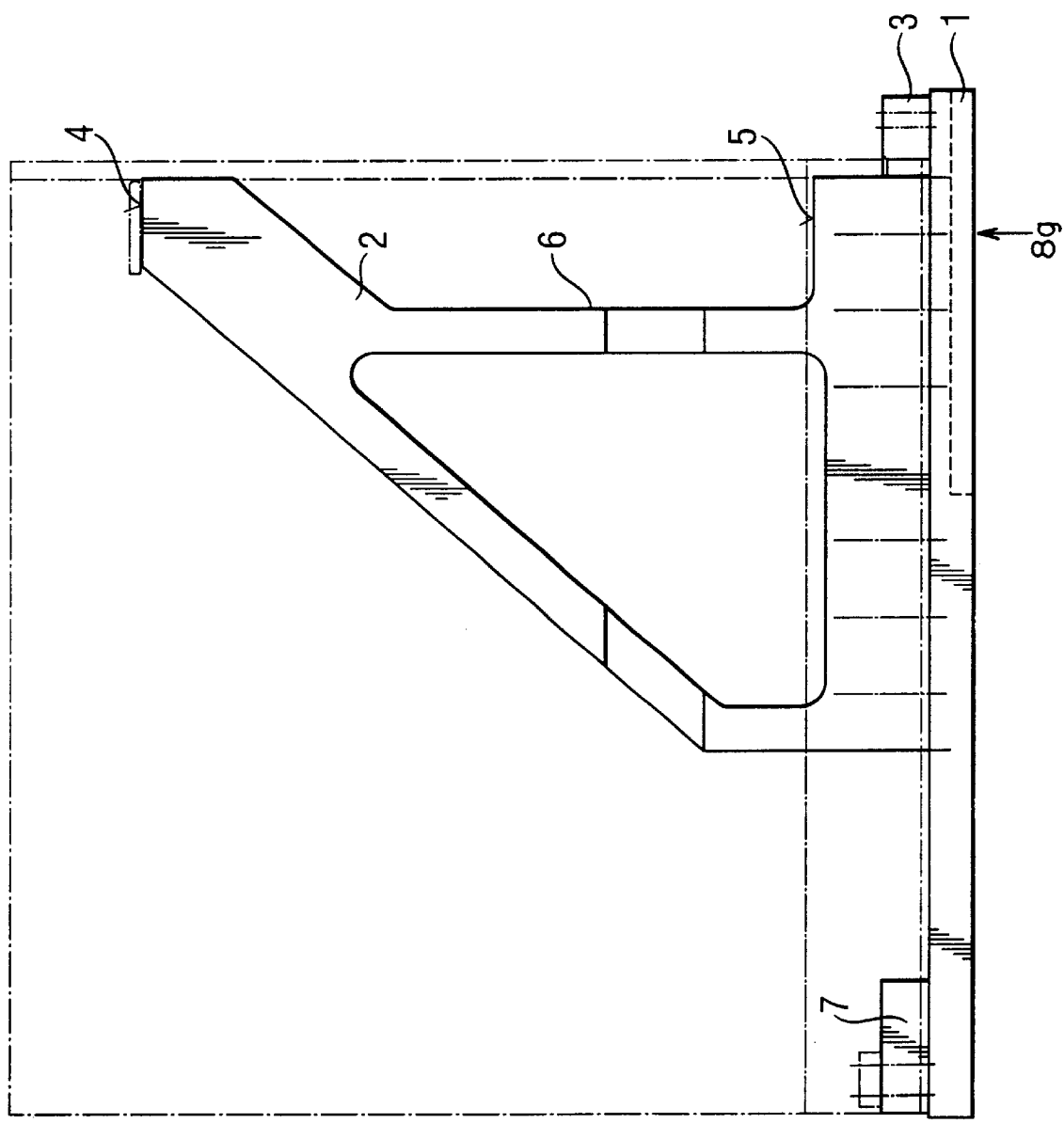

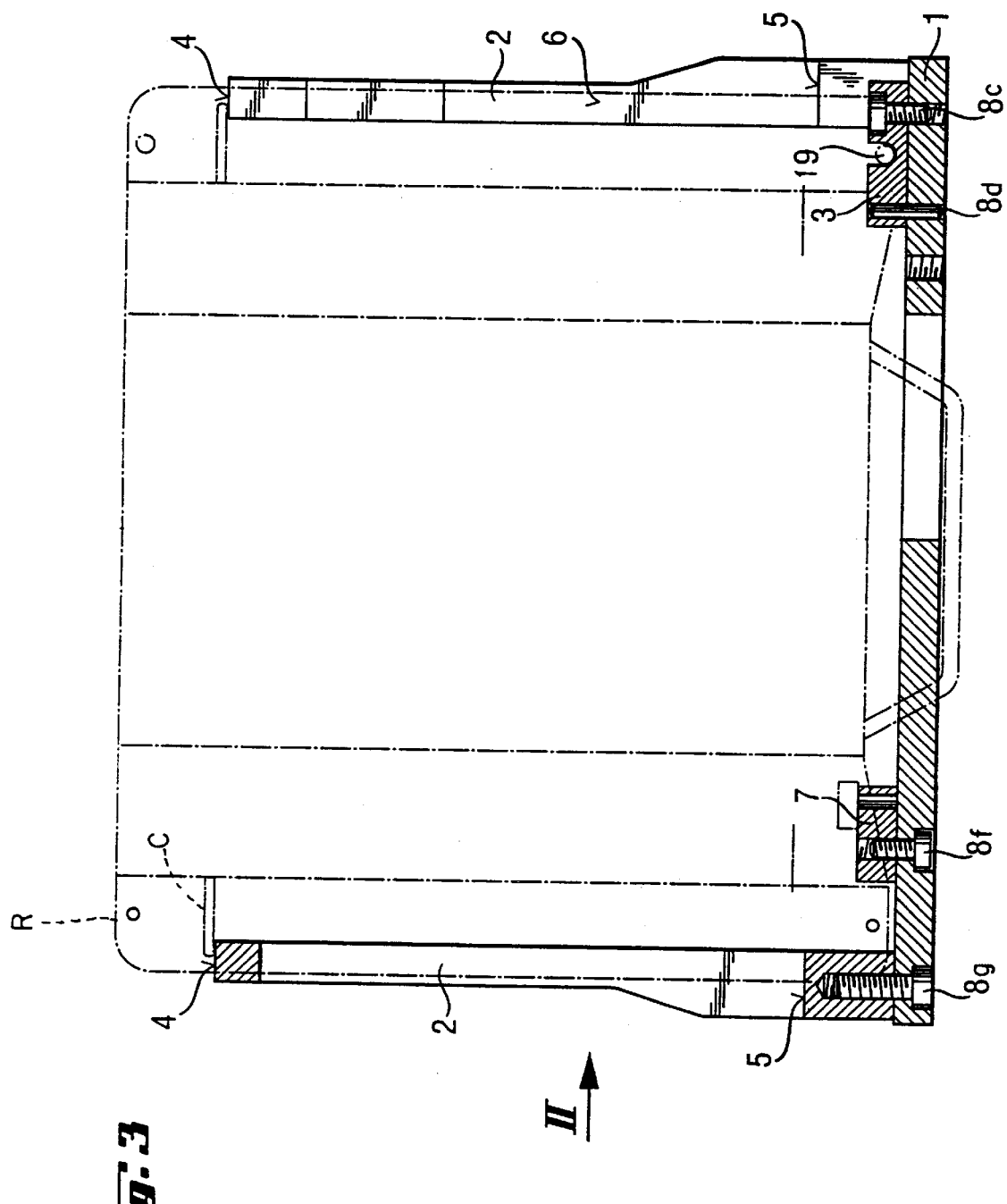

RACK HOLDING DEVICE

BACKGROUND OF THE INVENTION

1. Field of the Invention

The present invention relates to a rack-holding device.

2. The Prior Art

Rack-holding devices for racks which hold disks, such as silicon wafers, are known. The known rack-holding devices simply have grooves and webs which are milled into the basic surface and into which the racks are placed. Furthermore, there is a sensor on this basic surface, which records that the rack has been placed into the rack-holding device or has left the device again. Racks of this nature are designed in such a way that they are able to accommodate twenty-five wafers horizontally above one another. These racks serve as storage containers and transport containers. In such racks, preferably silicon wafers are introduced into a polishing machine, from which a gripper picks them up in succession in order to subject time to a polishing process. The same happens in a measuring device in which they are checked for defects, as well as anywhere else where disks or silicon wafers are handled horizontally.

A drawback of these rack-holding devices is that the racks become tilted and warped therein, or the rack itself is warped, so that the gripper cannot pick up the wafers correctly, with the result that the valuable wafers are damaged or destroyed. Furthermore, the racks may bend, so that the sensor does not detect that there is a rack in the rack-holding device, and the corresponding polishing machine or measuring device does not start to work.

SUMMARY OF THE INVENTION

It is an object of the present invention to provide a device to overcome the drawbacks of the prior art, and in particular to arrange the racks, and thus the wafers, in a defined position.

The above object is achieved according to the present invention by providing a rack-holding device with an attachment surface, which device has at least two side guides and at least one stop. The stop is arranged in each case in front of the at least two side guides, and the two side guides are arranged parallel to and at a distance from one another. The two side guides are designed in such a way that they have a bearing surface at essentially the same height.

BRIEF DESCRIPTION OF THE DRAWINGS

Other objects and features of the present invention will become apparent from the following detailed description considered in connection with the accompanying drawings which discloses several embodiments of the present invention. It should be understood, however, that the drawings are designed for the purpose of illustration only and not as a definition of the limits of the invention.

In the drawing, wherein similar references characters denote similar elements throughout the several views:

FIG. 1 shows a plan view of the rack-holding device of the invention;

FIG. 2 shows a side view (line of vision II) of the rack-holding device of FIG. 1; and FIG. 3 shows an end view of the rack-holding device of FIG. 1 (intersection III—III).

DETAILED DESCRIPTION OF PREFERRED EMBODIMENTS

Turning now in detail in FIG. 1, the rack-holding device according to the invention has an attachment surface 1, to which the at least two side guides 2 and the at least one stop 3 are attached. These elements may preferably form a movable unit, or else the attachment surface 1 is a component of another device, such as a measuring device or a polishing device, in which case the movable, non-stationary rack-holding device can be moved as a unit. The at least two side guides 2 are arranged parallel to and at a distance from one another, so that a rack R can rest, preferably by way of a bearing surface, e.g. a clip C. This preferably takes place on the preferably top planar bearing surface 4 of the side guides 2. If the rack is rotated through 180°, these bearing surfaces of the rack come to bear against the bottom planar bearing surface 5. A side guide 2 according to the invention has either, only the top bearing surface 4 or only the bottom bearing surface 5 or, both bearing surfaces 4 and 5.

In another embodiment, there may be a cutout 6 between the bearing surfaces 4 and 5, which represents a preferred embodiment. However, it is also conceivable for there to be a slot at the level of the bottom bearing surface 5, so that a wafer can be pushed in. The distance between the two bearing surface is preferably selected in such a way that the bottom wafer in the rack is always at the same distance from the attachment surface irrespective of whether it rests on top of the bearing surface 4 or the bearing surface 5, i.e. the rack has been rotated through 180°.

The at least one stop 3 is arranged in front of the end side of the guide 2, so that the rack can be supported against the stop at the front. If it is a single stop, this is preferably arranged in the center between the side guides 2. However, preference is given to two stops 3, which are arranged in front of each of the side guides 2, in such a way that the rack can be supported on both sides at the front. In a preferred embodiment, the stops 3 have cutouts 9 which are able to receive one or more projections 19 which are located on the rack, thus imparting additional stability to the rack. A sensor 7 which detects whether the rack is in position is situated on the attachment plate, preferably in the rear part. The stops 3, side guides 2 and the sensor 7 are attached to the attachment surface 1 by means of attachment means 8, as well as 8a, 8b, 8c, 8d, 8e, 8f and 8g preferably screws.

The advantages of the rack holder according to the invention are that the rack does not become tilted or warped therein, so that a gripper can pick up the wafers correctly, with the result that the valuable wafers are not damaged or destroyed. Furthermore, the racks no longer bend, so that the sensor is now always able to detect that there is a rack in the rack-holding device. Hence, the corresponding polishing machine or measuring device can operate correctly. Thus the wafer is always located at the same position with respect to the gripper of the robot. Thus handling errors, which previously represented 80% of the defects, no longer occur.

Accordingly, while a few embodiments of the present invention have been shown and described, it is to be understood that many changes and modifications may be made thereunto without departing from the spirit and scope of the invention as defined in the appended claims.

What is claimed is:

1. A rack-holding device comprising said device having a front and a rear;

an attachment surface (1);

at least two side guides (2) and at least one stop (3), the stop (3) being arranged in front of the at least two side guides (2);

the two side guides (2) being arranged parallel to and at a distance from one another;

the two side guides (2) being constructed in such a way that they have a bearing surface at essentially the same height;

the two side guides (2) are each connected to the attachment surface (1);

a sensor (7) located on said attachment surface (1) and said sensor detecting if a rack is in position on the rack-holding device, and wherein said sensor (7) is located at the rear of the device.

2. The rack-holding device of claim 1, wherein the two side guides (2) each have a top bearing surface (4) and a bottom bearing surface (5).

3. The rack-holding device of claim 2, further comprising a cutout (6) between the top bearing surface (4) and the bottom bearing surface (5).

4. The rack holding device of claim 1, wherein there are two stops (3), with one stop arranged in front of one side guide (2), and with another stop arranged in front of a second side guide (2).

5. The rack-holding device of claim 1, wherein the stop (3) has a cutout (9) which receives a projection (19) located on a rack.

* * * * *